US008972209B2

(12) United States Patent
Gajic et al.

(10) Patent No.: US 8,972,209 B2
(45) Date of Patent: Mar. 3, 2015

(54) METHOD AND ARRANGEMENT FOR DETECTING AN INTERNAL FAILURE IN H-BRIDGE CONNECTED CAPACITOR BANK

(71) Applicants: Zoran Gajic, Vasteras (SE); Jianping Wang, Vasteras (SE); Mustafa Ibrahim, Vasteras (SE)

(72) Inventors: Zoran Gajic, Vasteras (SE); Jianping Wang, Vasteras (SE); Mustafa Ibrahim, Vasteras (SE)

(73) Assignee: ABB Research Ltd. (CH)

( * ) Notice: Subject to any disclaimer, the term of this patent is extended or adjusted under 35 U.S.C. 154(b) by 0 days.

(21) Appl. No.: 13/968,814

(22) Filed: Aug. 16, 2013

(65) Prior Publication Data

US 2013/0338946 A1 Dec. 19, 2013

Related U.S. Application Data

(63) Continuation of application No. PCT/EP2011/052279, filed on Feb. 16, 2011.

(51) Int. Cl.
*G01R 31/00* (2006.01)
*G01R 31/02* (2006.01)
*H02H 7/16* (2006.01)

(52) U.S. Cl.
CPC .............. *G01R 31/028* (2013.01); *H02H 7/16* (2013.01)
USPC ........................................................ 702/58

(58) Field of Classification Search
CPC ..................................................... G01R 31/02
USPC ........................................................... 702/58
See application file for complete search history.

(56) References Cited

U.S. PATENT DOCUMENTS

| 3,143,687 | A | * | 8/1964 | Hjertberg et al. | 361/16 |
| 3,909,672 | A | * | 9/1975 | Lundquist et al. | 361/17 |
| 4,219,856 | A | * | 8/1980 | Danfors et al. | 361/15 |
| 4,805,063 | A | * | 2/1989 | Kataoka et al. | 361/16 |
| 4,956,739 | A | * | 9/1990 | Becker et al. | 361/16 |
| 5,506,743 | A | * | 4/1996 | Phillips | 361/85 |
| 6,107,808 | A | * | 8/2000 | McKee et al. | 324/548 |
| 6,211,684 | B1 | * | 4/2001 | McKee et al. | 324/548 |

(Continued)

FOREIGN PATENT DOCUMENTS

EP 0022992 A1 1/1981

OTHER PUBLICATIONS

Samineni et al., "Fault Location in Shunt Capacitor Banks", Developments in Power System Protection, 2010, pp. 1-4.*

(Continued)

*Primary Examiner* — John Breene
*Assistant Examiner* — Yaritza H Perez Bermudez
(74) *Attorney, Agent, or Firm* — St. Onge Steward Johnston & Reens LLC

(57) ABSTRACT

A method for detecting an internal failure in a capacitor bank connected in one phase or more phases respectively to a power system. The capacitor bank includes a plurality of capacitor units. Each of the capacitor units includes a plurality of capacitor elements connected in parallel and/or series. The capacitor units are further divided into two strings and a current transformer is arranged in the midpoints of the two strings so that the capacitor units are further divided into four quadrants and the internal failure(s) may occur in one or more capacitor elements or units and involves one or more capacitor quadrants. The method includes initiating an alarm and/or a trip signal when the determined total number of internal elements failures exceeds a first or a second threshold value.

18 Claims, 7 Drawing Sheets

(56) References Cited

U.S. PATENT DOCUMENTS

| | | | |
|---|---|---|---|
| 2008/0007230 A1 | 1/2008 | Kalyuzhny et al. | |
| 2010/0073831 A1* | 3/2010 | Schweitzer, III | 361/42 |
| 2010/0169029 A1* | 7/2010 | Benner et al. | 702/58 |
| 2010/0169030 A1* | 7/2010 | Parlos | 702/58 |
| 2010/0264666 A1* | 10/2010 | Bo et al. | 290/55 |
| 2013/0057297 A1* | 3/2013 | Cheng et al. | 324/548 |
| 2013/0155729 A1* | 6/2013 | Lee | 363/37 |
| 2013/0328569 A1* | 12/2013 | Gajic et al. | 324/521 |

OTHER PUBLICATIONS

Xiangyi, et al.; "Adjusting for the Unbalance of Capacitor Banks with H-Bridge Connection of Power Filter on UHVDC Converter Station"; 2010 International Conference on Power System Technology; 4 pages.

International Preliminary Report on Patentability Application No. PCT/EP2011/052279 Completed: Jan. 24, 2013 30 pages.

International Search Report & Written Opinion of the International Searching Authority Application No. PCT/EP2011/052279 Completed: Oct. 31, 2011; Mailing Date: Nov. 14, 2011 13 pages.

Samineni, et al.; "Principles of Shunt Capacitor Bank Application and Protection"; IEEE 2010; 14 pages.

Horton, et al.; "Unbalance Protection of Fuseless, Split-Wye, Grounded, Shunt Capacitor Banks"; IEEE Transaction on Power Delivery vol. 17, No. 3; Jul. 2002; pp. 698-701.

Vishay Intertechnology; "ESTAsym® MD" (see "Capacitor Unbalance Protection" on p. 2/4 and figure and text for bridge circuit on p. 4/6) 6 pages; May 8, 2007.

* cited by examiner

| Failure event | Instant of failure event (sec) | Unbalance current $I_{un}$ (p.u.) | Unbalance current step change ($I_{un\_step}$) | Currents phase angle $\Theta(I_{un}, I_{ph})$ (degrees) | Internal failures in quadrant 1 or 4 | Internal failures in quadrant 2 or 3 |
|---|---|---|---|---|---|---|
| 0 | - | 0 | 0 | 0 | 0 | 0 |
| 1 | 0.9 | 0,000486 | 0,000486 | 180 | 1 | 0 |
| 2 | 1.01 | 0,003537 | 0,003051 | 180 | 5 | 0 |
| 3 | 1.3 | 0,004023 | 0,000486 | 180 | 1 | 0 |
| 4 | 1.4 | 0,003537 | -0,000486 | 180 | 0 | 1 |
| 5 | 1.55 | 0,002529 | -0,001008 | 180 | 0 | 2 |
| 6 | 1.7 | 0,005580 | 0,003051 | 180 | 5 | 0 |

| Blown fuses | Unbalance "H" current, per unit of total phase current | Percentage current step change (relay set value) |
|---|---|---|
| f | $I_{un}$ | $I_{set}$ |
| 0 | 0.000000 | 0.000000% |
| 1 | 0.000486 | 0.024311% |
| 2 | 0.001007 | 0.074681% |
| 3 | 0.001567 | 0.128739% |
| 4 | 0.002171 | 0.186908% |
| 5 | 0.002823 | 0.249675% |
| 6 | 0.003529 | 0.317607% |
| 7 | 0.004298 | 0.391370% |
| 8 | 0.005137 | 0.471749% |
| 9 | 0.006057 | 0.559676% |
| 10 | 0.007069 | 0.656267% |
| 11 | 0.008189 | 0.762869% |
| 12 | 0.009434 | 0.881127% |
| 13 | 0.010827 | 1.013064% |
| 14 | 0.012397 | 1.161201% |
| 15 | 0.014178 | 1.328719% |
| 16 | 0.016216 | 1.519695% |
| 17 | 0.018572 | 1.739434% |
| 18 | 0.021327 | 1.994974% |
| 19 | 0.024590 | 2.295859% |

Fig. 7

METHOD AND ARRANGEMENT FOR DETECTING AN INTERNAL FAILURE IN H-BRIDGE CONNECTED CAPACITOR BANK

FIELD OF THE INVENTION

The present invention relates to the field of detecting an internal failure in a capacitor bank connected in one phase or more phases respectively to a power system. It relates in particular to detect an internal failure in H-bridge capacitor bank, wherein the capacitor bank comprises a plurality of capacitor units and each of the capacitor units comprises a plurality of capacitor elements connected in parallel and/or in series, and wherein the capacitor units are further divided into two strings. The midpoints of the two strings are tied together through a current transformer. Hence, the capacitor units are further divided into four quadrants and the internal failure may be in one or more capacitor elements or units and involves one or more capacitor quadrants in the capacitor bank.

BACKGROUND OF THE INVENTION

Capacitor banks are installed to improve the quality of an electrical supply by providing reactive power compensation and power factor correction in a power system. The use of capacitor banks has increased because they are relatively inexpensive, easy and quick to be installed, and can be deployed almost anywhere in a power system grid. Capacitor bank installations have other beneficial effects on the system such as improvement of the voltage profile, better voltage regulation, reduction of losses, increase of power transmission capacity and reduction or postponement of investments in the transmission and generation capacity.

A capacitor bank is assembled by a plurality of individual capacitor units. Each individual capacitor unit is a basic building block of the capacitor bank and includes a plurality of individual capacitor elements, arranged in parallel/series connected groups, within a metal enclosure. The units can be externally or internally fused, fuseless or unfused depending on the application of the bank. The elements can be connected to fuses and a group of elements is normally shunted by an internal discharge resistor in order to reduce the unit residual voltage after being disconnected from the power system. Each of the capacitor elements is constructed by winding two electrodes of aluminum foil separated by several layers of paper, or plastic film-insulated or a mixed dielectric of paper and plastic film.

Capacitor banks are normally further constructed using individual capacitor units connected in series and/or parallel to obtain a required voltage rating.

However, an internal failure in terms of operated fuses, failed elements and/or failed units in one or more quadrants may occur due to, for example the improper selection of the designed voltage rating that may result in continuous high voltage stress for the selected capacitor bank and eventually may lead to a dielectric failure of capacitor elements. Other causes for internal failure can be overcurrent, overvoltage, short-circuit, thermal failure and internal stress. It may also include maloperation of fuses due to bad fuse coordination.

The existing unbalance protection schemes are typically available to detect such an internal failure. For example, unbalance protection can be utilized in a variety of capacitor bank connections: grounded wye, ungrounded wye, delta, and single-phase. The H-bridge existing internal failure protection is based on a current measurement, typically by using a current transformer, in the link connecting two strings of capacitors together at the midpoints of the two strings. Any change in the capacitance of any capacitor will cause a change in the H current, also called unbalance current.

However, the existing unbalance protections based on the H-bridge scheme are liable to detect the number of internal failures incorrectly because an internal failure unbalance signal can be cancelled by having a combination of internal failures in any two or more adjacent quadrants. This consequently results in an ambiguity in terms of detecting the number of internal failures. Furthermore, such ambiguity may result in undetected failures in the capacitor bank, which may lead to a risk of fire or explosion accompanied by a severe damage of the whole capacitor bank before taking an early preventive action.

Furthermore, since a capacitor bank comprises a plurality of units each including a plurality of elements, failing to identify the location of an internal failure results in a costly maintenance because the whole capacitor bank has to be shut down and an exclusive search has to be carried out. More importantly, this could affect the availability of the capacitor bank.

U.S. Pat. No. 4,956,739 describes a protection system for a capacitor bank having a double-H bridge arrangement, where the unbalance currents are measured using two current transformers, and where failures are localized by phase angle calculations. However, no measure has been countered for a cancellation effect, which is a consequence of experiencing combination of internal failures in any two adjacent quadrants in H-bridge capacitor banks. The system therefore could not determine the exact number of internal failures in the bank, which affects the reliability and sensitivity of the system. Additionally, it is applicable only whenever there are two current transformers dividing each phase into 6 equal batteries of capacitor units with double H connected banks, not the typical H connected banks with one current transformer.

Document U.S. Pat. No. 4,219,856 (DANFORS ET AL) (D2) shows a protective device for a capacitive bank that counts current surges (see claim 1) and counting number of internal failures based on number of these surges, and includes polarity sensing means for distinguishing between surges emanating from one or the other of the capacitor branches (claim 6). Furthermore, D2 discloses (column 2, lines 25-30) the use of the stationary unbalance current protection relay disclosed in U.S. Pat. No. 3,143,687 (HJERTBERG ET AL) (D3). It would also be useful for these devices to provide a more reliable detection, especially in view of detecting combinations of internal failures with the possibilities of cancellation effects.

Therefore, a more sensitive and accurate internal failure detection and protection scheme for H-bridge arrangement is desired.

SUMMARY OF THE INVENTION

One object of the present invention is to provide an improved method for detecting an internal failure in a capacitor bank based on H-bridge unbalance current step change calculation, wherein the internal failure may occur in one or more capacitor element/unit and/or involves one or more capacitor quadrants in the capacitor bank.

The object is achieved by an unbalance current detection method, characterized in that the method further comprises continuously calculating a per unit value of the unbalance current based on the calculated RMS value of the measured phase current and the calculated RMS value of the measured unbalance current, tracking and detecting a change in the calculated unbalance current between the present calculated per unit value of the unbalance current and the previous calculated per unit value of the unbalance current, determining the step change of the per unit value of the unbalance current, determining the number of internal failures and their corresponding locations based on the determined step change of the per unit value of the unbalance current and the detected phase angle and initiating an alarm and/or a trip signal when the determined total number of internal elements failures exceeds a first or a second threshold value.

When a failure occurs in the capacitor bank, it will result in a change of the unbalance current on the H-bridge. This failure may involve one or more internal failures. The failure can be distinguished by detecting an unbalance current peak occurrence as a failure event, which occurred during the arcing over the defective capacitors. However, in the case that two successive internal failures involve two adjacent quadrants, the internal failure from one quadrant may cancel the unbalance current signal generated by another quadrant, which results in either no unbalance current detection or no unbalance current change detection. Consequently, the exact number of internal failures cannot be correctly determined. According to the invention, such a cancellation effect is precluded by determining the exact number of the internal failures based on the step change behavior of the unbalance current and, the relation between the sign of that step change of the per unit value of the unbalance current of its corresponding phase current and the detected phase angle. Therefore, the invention makes it possible to determine the exact number of the internal failures.

Due to the fact that the invention makes it possible to determine the exact number of the internal failures, the invention makes it possible to take a correct action by sending a proper alarm and/or trip signal based on this more accurate information, which furthermore provides a more sensitive and reliable unbalance H-bridge protection scheme and solution.

Furthermore, based on the relation between the sign of the step change of the per unit value of the unbalance current and the detected phase angle, the location of the internal failure can be determined in terms of detecting the possible two quadrants experienced the failure event, while the two quadrants are located diagonally. It is advantageous that the location of the internal failures is identified to make maintenance of the capacitor bank more effectively. Theoretically, the invented method saves 50% of the time dedicated for detecting the faults.

A further advantage of the invention is that a scheduled maintenance can be avoided in case that there is no internal failures detected or the number of internal failures per phase is less than certain limit.

It is advantageous to use the per unit value of the unbalance current because it is independent of system transients and less dependent of the temperature and frequencies variation of the capacitor bank. Therefore, there is no need to compensate the unbalance signal due to such variations or to consider delay time in order to avoid transients. This per unit value may be further scaled to a pre-defined threshold value so that the number of internal failures corresponding to this particular unbalance current can be determined.

Yet another advantage of the invention is that it is not needed to compensate the natural unbalance current in order to obtain an accurate unbalance signal. This is because the detection is based on the step change of the unbalance current.

According to one embodiment of the invention, the step change is determined by detecting a change of the unbalance current, tracking the change of the unbalance current and continuously comparing the change with a pre-defined threshold value. This is achieved by starting tracking the change of the unbalance current after a short delay to avoid the effect of the abrupt change during arcing followed by a decay of the unbalance current and ending tracking when the unbalance current reaches a steady state.

According to another embodiment of the invention, the detected phase angle is normalized, for example to be either 0° or 180°, and the number of internal failures is determined based on determined step change of the per unit value of the unbalance current and the normalized phase angle.

According to one embodiment of the invention, the alarm signal is determined when the number of the internal failures in any of the quadrants exceeds the first threshold.

According to one embodiment of the invention, the trip signal is determined when the number of the internal failures in any of the quadrants exceeds the second threshold.

According to one embodiment of the invention, the first and second threshold values are corresponding to an alarm and trip levels respectively. Therefore, the alarm level is equivalent to the number of faulted elements, units or the number of operated fuses depending on the configuration in any quadrant exceeds a predefined overvoltage limit across the healthy ones, this limit may be set above the natural errors to operate reliably after internal failures. The trip level is the maximum number of faulted elements, operated fuses or shorted units depending on the configuration that results in an extra voltage on the healthy capacitors, which does not exceed the contingency overvoltage capability of these capacitors. However, new threshold values may be also introduced.

The object of the invention is also achieved by an arrangement. Such an arrangement comprises, for each individual phase, a first current transformer, a second current transformer, a computing unit and a detective unit. The first current transformer is arranged to measure the phase current. The second current transformer is arranged in the midpoints of the two strings for measuring the unbalance current. A computing unit is configured to continuously calculate the RMS value of the measured phase current, continuously calculate the RMS value of the measured unbalance current, and continuously calculate the per unit value of the unbalance current based on the calculated RMS value of the measured phase current and the calculated RMS value of the measured unbalance current. The detective unit is configured to detect the phase angle between the measured phase current and its corresponding measured unbalance current, track and detect a change in the calculated unbalance current between the present calculated per unit value of the unbalance current and the previous calculated per unit value of the unbalance current, determine the step change of the per unit value of the unbalance current, determine the number of internal failures and their corresponding locations based on the determined step change of the per unit value of the unbalance current and the detected phase angle and initiate an alarm and/or a trip signal when the determined number of elements failures exceeds a first or a second threshold value.

Furthermore, the protective unit is further configured to track the change of the unbalance current and continuously compare the change with a pre-defined threshold value to determine the step change of the per unit value of the unbalance current.

Moreover, the protective unit is further configured to normalize the detected phase angle and determine the number of internal failures and their corresponding locations based on the determined step change of the per unit value of the unbalance current and the normalized phase angle.

According to an embodiment of the invention, the present method is implemented by a computer program product.

Such a computer program product comprises receiving measured phase current, calculating the RMS value of the measured phase current, receiving measured unbalance current, calculating the RMS value of the measured unbalance current, detecting the phase angle between the measured phase current and its corresponding measured unbalance current, calculating the per unit value of the unbalance current based on the calculated RMS value of the measured phase current and the calculated RMS value of the measured unbalance current, tracking and detecting a change in the calculated unbalance current between the present calculated per unit value of the unbalance current and the previous calculated per unit value of the unbalance current, determining the step change of the per unit value of the unbalance current, determining the number of the internal failures and the location of each of the internal failures based on the determined step change of the per unit value of the unbalance current and the detected phase angle, and initiating an alarm and/or a trip signal when the determined total number of internal failures exceeds a first or a second threshold value.

The computer program product may further comprises normalizing the detected phase angle and determining the number of internal failures and their corresponding locations based on the determined step change of the per unit value of the unbalance current and the normalized phase angle.

Such a computer program can be loaded from a readable medium into the memory of a computing processor, for example, the computing processor of an electrical device to provide this improved unbalance current protection for H-bridge capacitor bank.

BRIEF DESCRIPTION OF THE DRAWINGS

The invention is now explained more closely by the description of different embodiments of the invention and with reference to the accompanying drawings in which:

FIGS. 3A-B show respectively the number of internal failures in each of two diagonally arranged quadrant groups corresponding to the instantaneous failure events shown in FIG. 2a;

FIGS. 6A-B illustrate exemplarily a schematic configuration of the capacitor units arranged in each of the quadrants and a schematic configuration of capacitor elements in each of capacitor units of the capacitor bank shown in FIG. 6; and FIG. 7 shows an example of a look up table presenting the number of internal failures corresponding to the step change of the per unit value of the unbalance current based on the arrangement shown in FIGS. 6a-b.

DETAILED DESCRIPTION OF THE INVENTION

Figure 1:
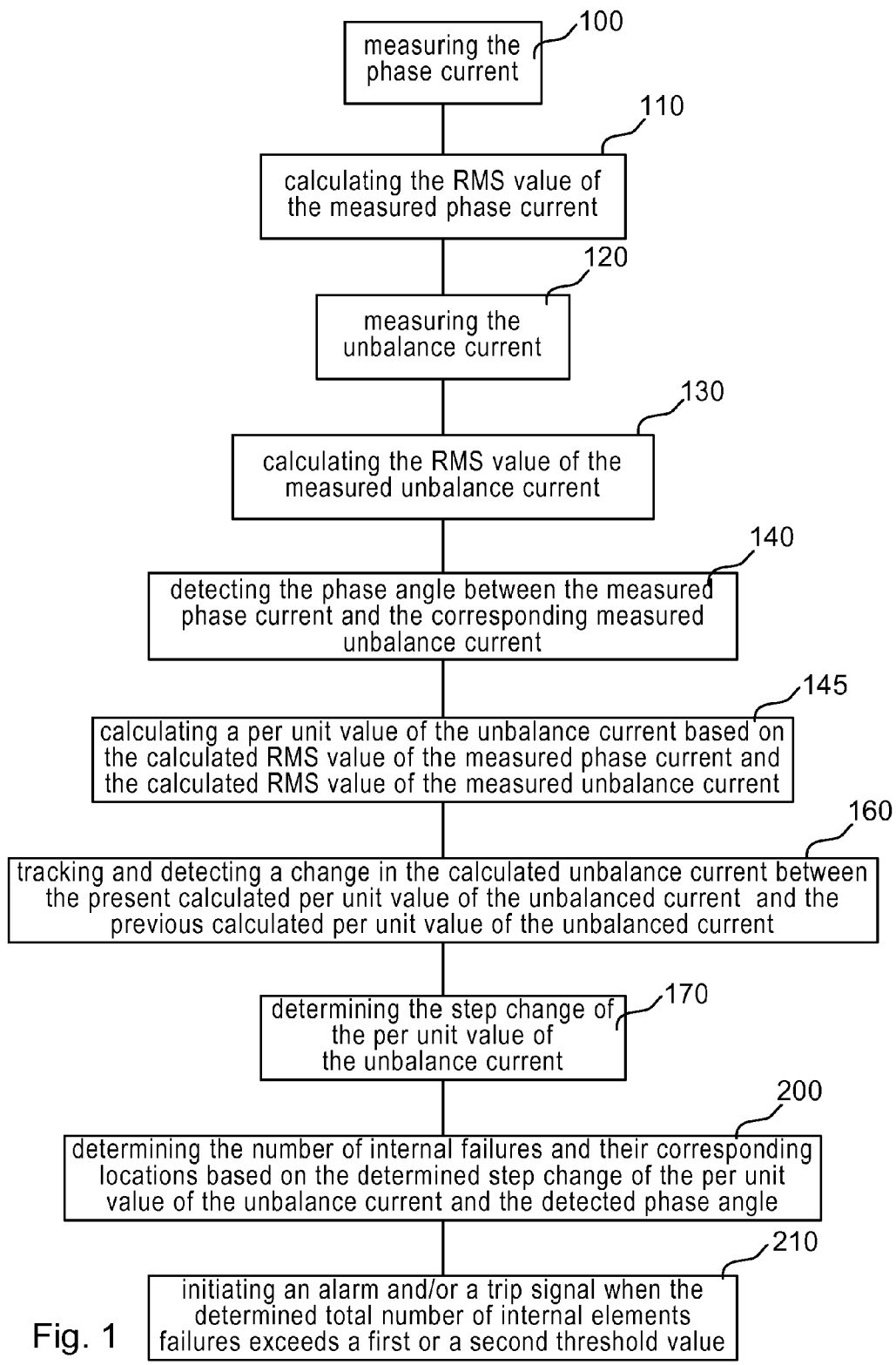
FIG. 1 is a flow chart illustration of the invented method for detecting an internal failure in H-bridge capacitor bank, according to one embodiment of the invention.
Figure 6:
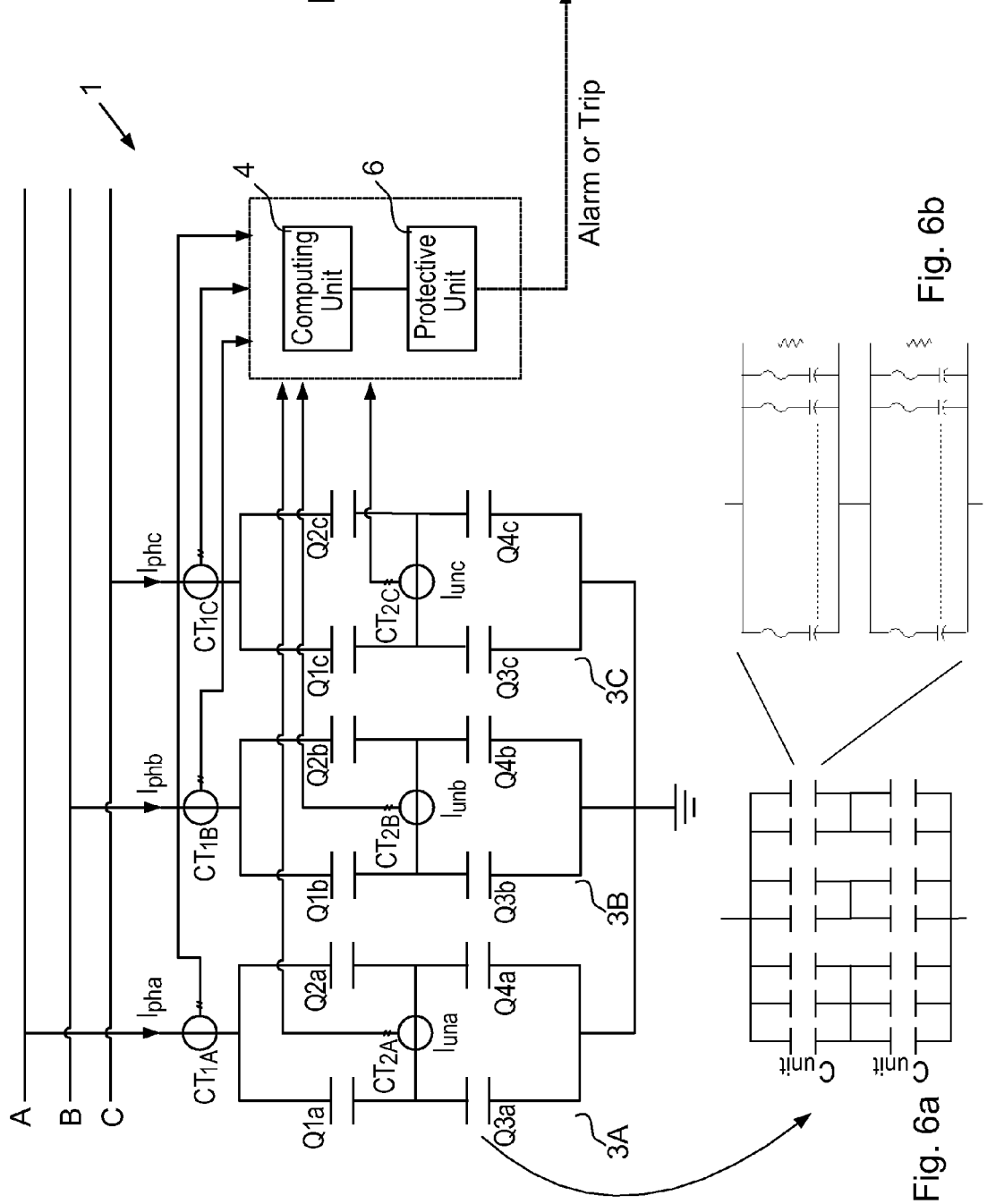
FIG. 6 illustrates schematically an arrangement for detecting an internal failure in a capacitor bank where the capacitor bank is connected to a three-phase power system and each phase includes one H-bridge protection scheme, according to an embodiment of the invention.

With reference to FIG. 6 and FIG. 1, an arrangement 1 for detecting an internal failure of a capacitor bank connected, at its one end of terminals, to a three-phase A, B and C electrical power system and grounded at another end of terminals. H-bridge capacitor bank 3A, 3B, 3C is connected to each of the phases A, B and C. Each of the H-bridges includes a first current transformer $CT_{1A}$, $CT_{1B}$, $CT_{1C}$ arranged for measuring each respective phase current $I_{pha}$, $I_{phb}$, $I_{phc}$, at step 100, a second current transformer $CT_{2A}$, $CT_{2B}$, $CT_{2C}$ arranged for measuring each respective unbalance current $I_{una}$, $I_{unb}$, $I_{unc}$, at step 120, a computing unit 4 and a protection unit 6.

The second current transformer $CT_{2A}$, $CT_{2B}$, $CT_{2C}$ is arranged in the midpoint of the two strings so the capacitor units are divided into four quadrants Q1a, Q2a, Q3a and Q4a; Q1b, Q2b, Q3b and Q4b; Q1c, Q2c, Q3c and Q4c. The capacitor units in each quadrant can be parallel and/or series-connected each including a plurality of capacitor elements connected in parallel and/or in series.

In this example, in each of the phases, the capacitor bank 3A, 3B, 3C is divided into 4 identical quadrants; each quadrant has 14 capacitor units distributed over three strings. Two strings have two series groups of two parallel-connected capacitor units, while the third string has two series groups of three parallel-connected capacitor units as shown FIG. 6a. Each capacitor unit has two series groups of 19 parallel-connected capacitor elements as shown in FIG. 6b.

However, it should be understood that the invention is not limited to this specific configuration. It should be understood that although, in this particular example, the capacitor bank has an internal fused configuration, but the invention is also applicable to any type of fused, fuseless or unfused capacitor banks. Furthermore, the capacitor bank may be ungrounded.

The computing unit 4 is connected to the first and second current transformers $CT_{1A}$ and $CT_{2A}$, $CT_{1B}$ and $CT_{2B}$, $CT_{1C}$ and $CT_{2C}$, of each individual phase A, B, C. Furthermore, the computing unit 4 is configured to receive the measurements from the first and second current transformers and to calculate respectively the RMS values of the measured phase current and unbalance current at steps 110 and 130. All measurements are based on sampling the instantaneous currents. The samples may be kept in a buffer in a memory for providing a moving snapshot of the input signal and applying recursive RMS current calculations.

Furthermore, the per unit value of the unbalance current can be calculated based on the ratio between the calculated RMS value of the measured unbalance current and the measured or calculated RMS value of the phase current as follows in step 145, $$I_{unpu} = \frac{I_{unrms}}{I_{phrms}}$$

Additionally, this per unit value may be further scaled to a pre-specified value contained in a look-up table, see FIG. 7 as an example, wherein, for each of unbalance current values, the number of internal failures corresponding to this value is provided. In this example, the number of internal failures is presented as the number of blown fuses or failed elements.

The protective unit 6 is configured to communicate with the computing unit 4 and its main function is to determine the number of internal failures and the location of the failures and to send an alarm signal and/or a trip signal based on the number of the internal failures. The alarm or trip signals may be sent to an operator's supervision display in an automation substation and the trip signal may be sent further to a circuit breaker in order to disconnect the electrical connection to the power system. In this embodiment, the computing unit 4 and the protective unit 6 are configured as two separate modules. However, they can be integrated as one unit as intelligent electronic device (IED). The computing unit 4 and the protective unit 6 can be for example a micro-computing processor, a digital signal processor, a field-programmable gate array, or a standard computer.

Based on the calculated RMS values of the measured phase current and the measured unbalance current, the protective unit 6 is further configured to detect the phase angle, at step 140. The calculated phase angle may be further normalized to be either 0° or 180° in order to detect the possible two quadrants experiencing the failure event.

In the configuration shown in FIGS. 6b, in case that quadrant Q2a or Q3a is experiencing the failure event, the unbalance current is in phase with the phase current, meaning the calculated phase angle is equal to 0°. In case that quadrant Q1a or Q4a is experiencing the failure event, the unbalance current is out of phase with the phase current, meaning the calculated phase angle is equal to 180°. However, for fuseless and unfused capacitor banks, the unbalance current angle equivalent to element failures in quadrants is the opposite to this example, i.e., 180° is equivalent to element failures in quadrants Q2a or Q3a, while 0° is equivalent to element failures in Q1a or Q4a.

Figure 2A:
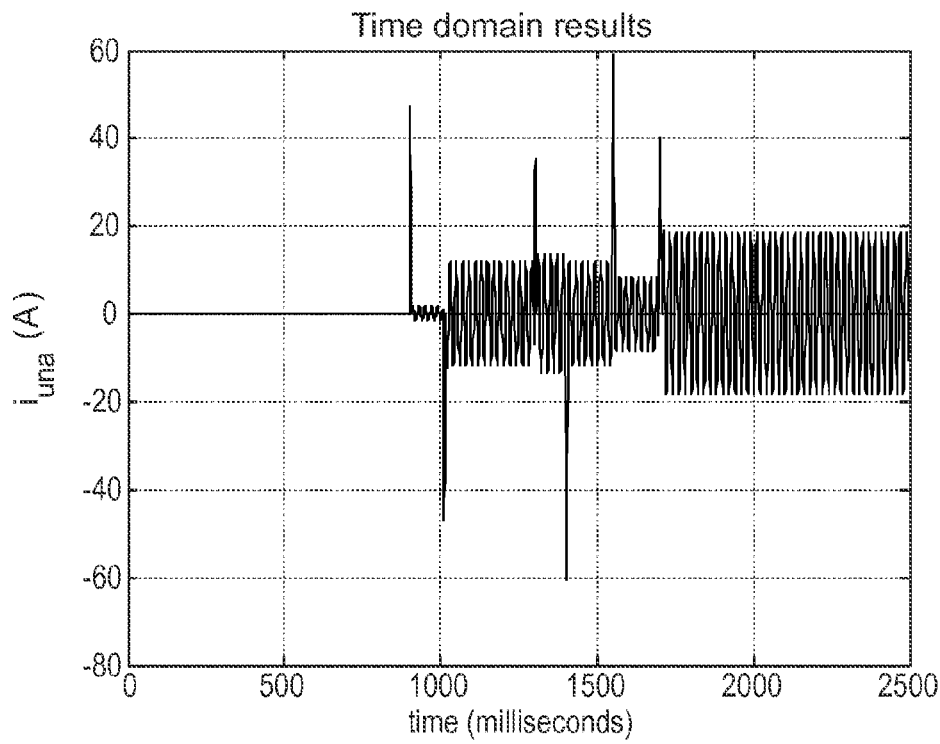
FIGS. 2A-C illustrate respectively instantaneous unbalance current waveform, the corresponding per unit value of the unbalance current and the phase angle between the unbalance current and the phase current in a simulation test in an example where six failure events are detected.
Figure 2B:
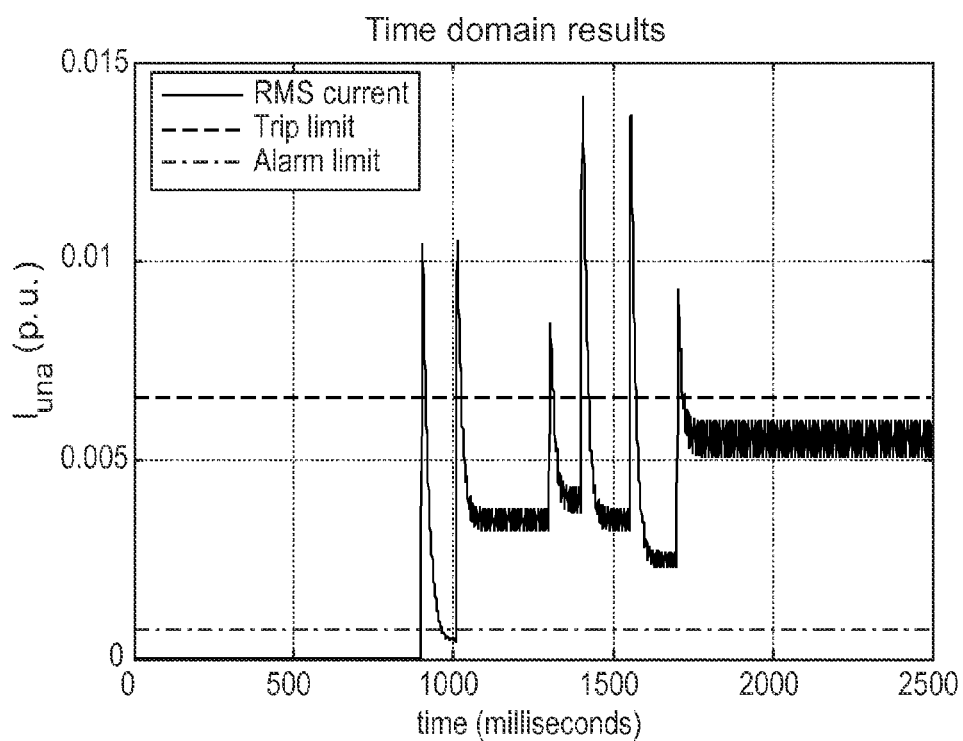
Figures 2C, 4:
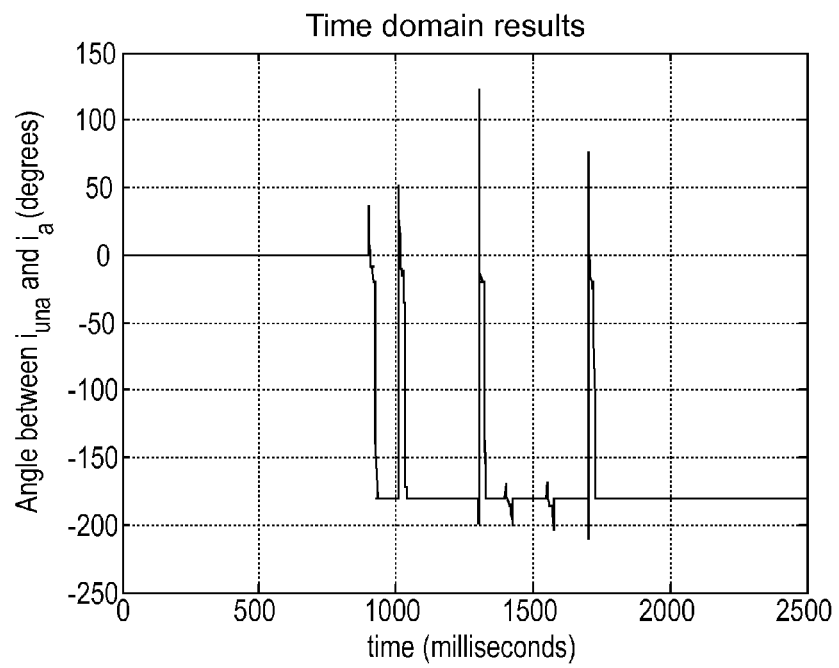
FIG. 4 shows an example of how information for each of instantaneous failure events is kept and recorded in a table for a decision of sending an alarm or a trip signal.

With reference to the examples shown in FIG. 2a-c, the invention is further explained. In this experiment, the capacitor bank 3A connected to the phase A has experienced 6 failure events in phase A, starting from the instant 0.9 second, the failure events are distinguished by 6 current peak occurrences as shown in FIG. 2a. These peaks occurred during the arcing over the capacitor elements before the fusing links rupture. Each of the failure events is recognized as a change of unbalance current between the present calculated magnitude of the unbalance current and the previous calculated magnitude of the unbalance current at step 160. Such a change can be determined by comparing the change with a pre-defined threshold and if the change is greater than the threshold, the change will be tracked. The FIG. 2b illustrates the corresponding unbalance current waveform per unit of the phase current and the typical current limits set for both alarm and trip signals are corresponding to one or ten internal failures. FIG. 2c shows the phase angles between the unbalance current and the phase current corresponding to the failure events. By tracking the change until it reaches its steady state, the step change of the unbalance current is determined at step 170.

Based on the step change of the unbalance current and the detected phase angle between the unbalance current and the phase current, the number of internal failures and the location of each of the failures can be determined at step 200.

Figure 5A:
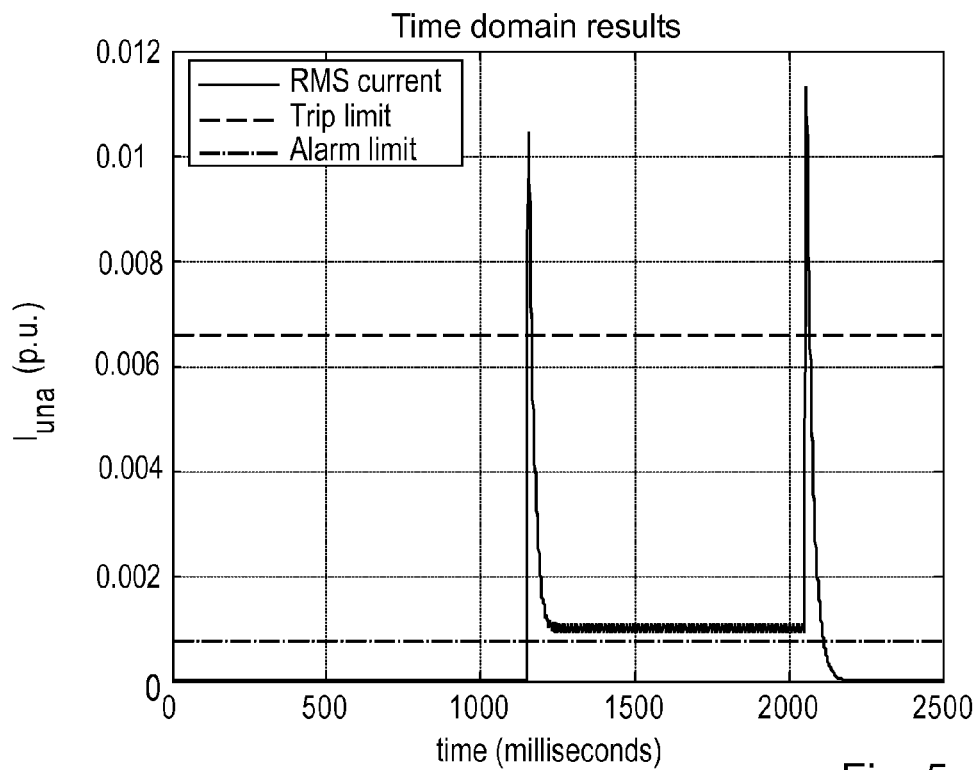
FIGS. 5A-B illustrate two scenarios, in each of which, an ambiguous detection may appear.
Figure 5B:
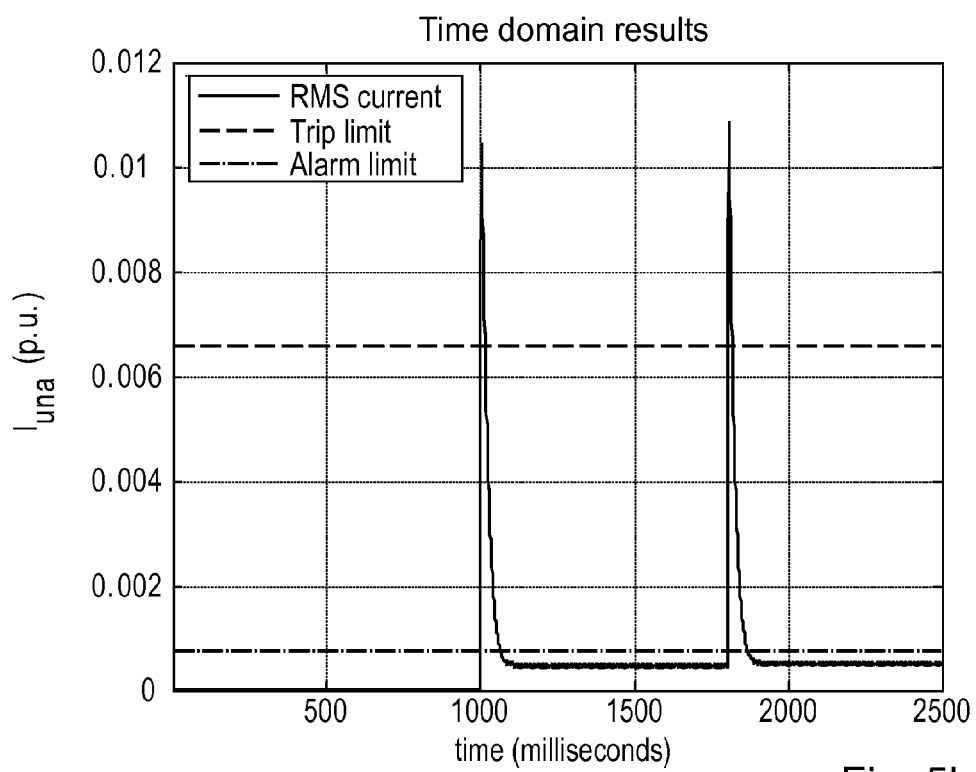

FIGS. 5a and 5b explain two examples of scenarios each could result in an ambiguous detection. The first example shown in FIG. 5a is of a scenario in which a complete cancellation effect takes place. The first failure event is of two blown fuses in quadrant Q1a at 1.15 sec and the second failure event at 2.05 sec is of two other blown fuses in either quadrant Q2a or Q3a. Because the unbalance current is in opposite direction to the current of previous failure, it results in negating the unbalance signal to be zero and an ambiguous detection due to no unbalance current was detected. The second example shown in FIG. 5b is of a second scenario in which a partial cancellation effect takes place. A single element failure in Q1a at 1.0 sec. 0.8 seconds later, two elements fail simultaneously, but in an adjacent quadrant (either Q2a or Q3a). The unbalance current caused by the second failure event is almost as twice as it was caused by the first one but in opposite direction, which makes no change in the unbalance current to be seen.

These ambiguities are solved by the embodiment of the invented method. In case that a step change of the unbalance current is detected, the number of internal failures can be obtained based on a look-up table as exemplified in FIG. 7. Then the location of the internal failures is determined by calculating the number of internal failures, which can be recorded by a counter of internal failures in any of the quadrants Q1a or Q4a or in any of the quadrants Q2a or Q3a. The counter is then updated accordingly. This branch solves the problem of the full cancellation effect.

In case that there is no step change of the unbalance current and at least one failure event was detected, this means that a partial cancellation effect is detected and the number of internal failures is then determined.

Figure 3A:
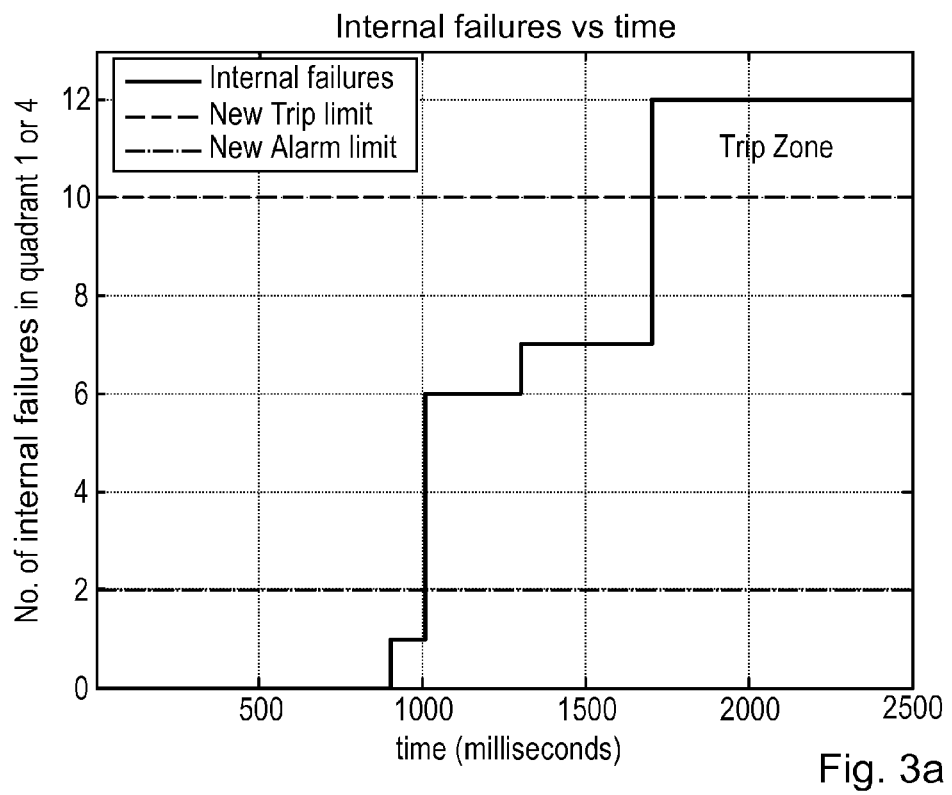
Figure 3B:
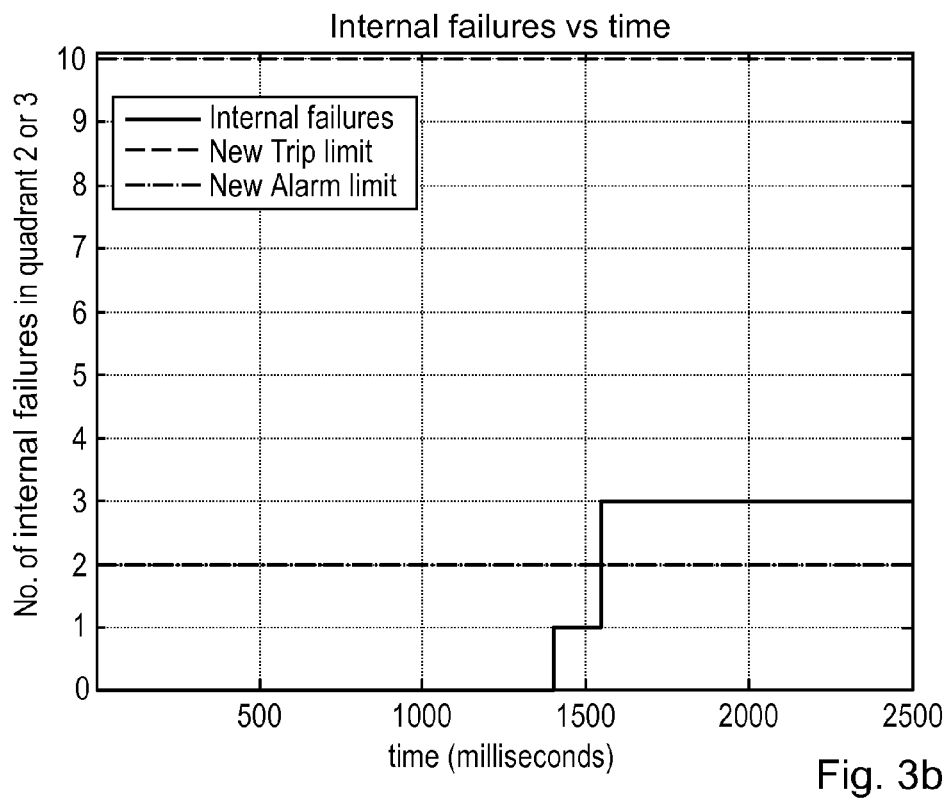

FIGS. 3a and 3b together show an example of the number of internal failures recorded in each of two diagonally arranged quadrant groups corresponding to each of the instantaneous failure events, wherein new alarm and trip limits are introduced. The new limits initially are set based on the maximum allowable number of internal failures before having the voltage on the remaining healthy capacitors exceeds the contingency overvoltage capability of these capacitors. In this example, the alarm limit is set after two internal failures and the trip signal is set after ten internal failures.

In both of the above described cases, the procedure ends up with updating the internal failure information in a table shown in FIG. 4, wherein the information about the number of internal failures and the location of the failures are updated accordingly for making decision regarding sending an alarm and/or a trip signal, step 210.

The presented invention overcomes the ambiguity problems resulted from the wrong detection. This wrong detection occurred due to cancellation effect, which resulted in not sending the proper trip signal as explained in the example demonstrated in FIG. 2b. The invention overcomes this problem as explained and demonstrated in FIGS. 3a and 3b by sending the proper alarm and trip signals. The action signals, for example alarm and trip signals, are sent based on the newly introduced limits. The new limits are based on the actual number of failures instead of the existing method that is dependent on the latest measured unbalance current.

What is claimed is:

1. A method for detecting an internal failure in a capacitor bank connected in one phase or more phases respectively to a power system, wherein the capacitor bank comprises a plurality of capacitor units, each of the capacitor units comprising a plurality of capacitor elements connected in parallel and/or series and wherein the capacitor units are divided into two strings and a current transformer is arranged in the midpoints of the two strings so that the capacitor units are further divided into four quadrants and the internal failure(s) may occur in one or more capacitor elements or units and involves one or more capacitor quadrants, the method comprises:
    measuring the phase current of each individual phase of the capacitor bank;
    continuously calculating the root mean square value, denoted by RMS value, of the measured phase current;
    measuring the unbalance current;
    continuously calculating the RMS value of the measured unbalance current, and detecting the phase angle between the measured phase current and its corresponding measured unbalance current;

continuously calculating a per unit value of the unbalance current based on the calculated RMS value of the measured phase current and the calculated RMS value of the measured unbalance current;

tracking and detecting a change in the calculated unbalance current between the present calculated per unit value of the unbalance current and the previous calculated per unit value of the unbalance current;

determining the step change of the per unit value of the unbalance current; and determining the number of internal failures based on the determined step change of the per unit value of the unbalance current and the detected phase angle.

2. The method according to claim 1, wherein the method further comprises tracking the change of the unbalance current and continuously comparing the change with a pre-defined threshold value so as to determine the step change of the per unit value of the unbalance current.

3. The method according to claim 1, wherein the method further comprises locating the internal faults to two possible quadrants based on the detected phase angle.

4. The method according to claim 3, wherein the method further comprises normalizing the detected phase angle and determining the number of internal failures and their corresponding locations based on the determined step change of the per unit value of the unbalance current and the normalized phase angle.

5. The method according to claim 3, wherein an alarm signal is initiated when the number of the internal failures in any group of two quadrants exceeds the first threshold.

6. The method according to claim 3, wherein a trip signal is initiated when the number of the internal failures in any group of two quadrants exceeds the second threshold.

7. The method according to claim 1, wherein the method further comprises initiating an alarm and/or a trip signal when the determined total number of internal elements failures exceeds a first or a second threshold value.

8. The method according to claim 5, wherein the first and second threshold values are corresponding to a lower and a higher limit of an allowable excessive voltage over the remaining healthy parts of the capacitor bank.

9. An arrangement for detecting an internal failure in a capacitor bank connected in one phase or more phases respectively to a power system, wherein the capacitor bank comprises a plurality of capacitor units and each of the capacitor units comprises a plurality of capacitor elements, and wherein the capacitor units are further divided into two strings and each further divided into two group in a midpoint so that the capacitor units are divided into four quadrants and the internal failure(s) may occur in one or more capacitor elements or units and involve one or more capacitor quadrants, the arrangement comprising:

a first current transformer arranged to measure the phase current of each individual phase;

a second current transformer arranged in the midpoints of the two strings for measuring the unbalance current of each individual phase;

a computing unit configured to:
continuously calculate the RMS value of the measured phase current;
continuously calculate the RMS value of the measured unbalance current;
continuously calculate the per unit value of the unbalance current based on the calculated RMS value of the measured phase current and the calculated RMS value of the measured unbalance current; and a protective unit configured to:
detect the phase angle between the measured phase current and its corresponding measured unbalance current; and
track and detect a change in the calculated unbalance current between the present calculated per unit value of the unbalance current and the previous calculated per unit value of the unbalance current;

characterized in that the protective unit is further configured to;
determine the step change of the per unit value of the unbalance current; and
determine the number of internal failures based on the determined step change of the per unit value of the unbalance current and the detected phase angle.

10. The arrangement according to claim 9, wherein the protective unit is further configured to track the change of the unbalance current and continuously compare the change with a pre-defined threshold value so as to determine the step change of the per unit value of the unbalance current.

11. The arrangement according to claim 9, wherein the protective unit is further configured locate the internal faults to two possible quadrants based on the detected phase angle.

12. The arrangement according to claim 11, wherein the protective unit is further configured to normalize the detected phase angle and determine the number of internal failures and their corresponding locations based on the determined step change of the per unit value of the unbalance current and the normalized phase angle.

13. The arrangement according to claim 9, wherein the protective unit is further configured to initiate an alarm and/or a trip signal when the determined number of elements failures exceeds a first or a second threshold value.

14. A non-transitory computer readable medium having a program recorded thereon, the program for detecting an internal failure in a capacitor bank connected in one phase or more phases respectively to a power system, wherein the capacitor bank comprises a plurality of capacitor units, each of the capacitor units comprising a plurality of capacitor elements connected in parallel and/or series and wherein the capacitor units are divided into two strings and a current transformer is arranged in the midpoints of the two strings so that the capacitor units are further divided into four quadrants and the internal failure(s) may occur in one or more the capacitor elements or units and involves one or more capacitor quadrants, wherein the computer program is directly loadable into the internal memory of a computer, comprising software to perform the steps of:

receiving measured phase current;
calculating the RMS value of the measured phase current;
receiving measured unbalance current;
calculating the RMS value of the measured unbalance current;
detecting the phase angle between the measured phase current and its corresponding measured unbalance current;
calculating the per unit value of the unbalance current based on the calculated RMS value of the measured phase current and the calculated RMS value of the measured unbalance current;
tracking and detecting a change in the calculated unbalance current between the present calculated per unit value of the unbalance current and the previous calculated per unit value of the unbalance current;

determining the step change of the per unit value of the unbalance current; and determining the number of the internal failures based on the determined step change of the per unit value of the unbalance current and the detected phase angle.

15. The non-transitory computer readable medium according to claim 14, wherein the computer program further comprises software to perform step of locating the internal faults to two possible quadrants based on the detected phase angle.

16. The non-transitory computer readable medium according to claim 15, wherein the computer program further comprises software to perform steps of normalizing the detected phase angle and determining the number of internal failures and their corresponding locations based on the determined step change of the per unit value of the unbalance current and the normalized phase angle.

17. The non-transitory computer readable medium to claim 14, wherein the computer program further comprises software to perform step of initiating an alarm and/or a trip signal when the determined total number of internal failures exceeds a first or a second threshold value.

18. A non-transitory computer readable medium having a program recorded thereon, where the program is to make a computer perform the steps, when said program is run on the computer, for detecting an internal failure in a capacitor bank connected in one phase or more phases respectively to a power system, wherein the capacitor bank comprises a plurality of capacitor units, each of the capacitor units comprising a plurality of capacitor elements connected in parallel and/or series and wherein the capacitor units are divided into two strings and a current transformer is arranged in the midpoints of the two strings so that the capacitor units are further divided into four quadrants and the internal failure(s) may occur in one or more the capacitor elements or units and involves one or more capacitor quadrants, comprising the steps of:

receiving measured phase current;

calculating the RMS value of the measured phase current;

receiving measured unbalance current;

calculating the RMS value of the measured unbalance current;

detecting the phase angle between the measured phase current and its corresponding measured unbalance current;

calculating the per unit value of the unbalance current based on the calculated RMS value of the measured phase current and the calculated RMS value of the measured unbalance current;

tracking and detecting a change in the calculated unbalance current between the present calculated per unit value of the unbalance current and the previous calculated per unit value of the unbalance current;

determining the step change of the per unit value of the unbalance current; and determining the number of the internal failures based on the determined step change of the per unit value of the unbalance current and the detected phase angle.

* * * * *